United States Patent
Lin

(10) Patent No.: US 9,130,185 B2
(45) Date of Patent: Sep. 8, 2015

(54) ORGANIC LIGHT EMITTING DIODE

(71) Applicant: Xiamen Tianma Micro-Electronics Co., Ltd., Xiamen (CN)

(72) Inventor: Wenjing Lin, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 51 days.

(21) Appl. No.: 13/898,039

(22) Filed: May 20, 2013

(65) Prior Publication Data

US 2014/0175387 A1 Jun. 26, 2014

(30) Foreign Application Priority Data

Dec. 21, 2012 (CN) .......................... 2012 1 0566199

(51) Int. Cl.
*H01L 35/24* (2006.01)
*H01L 51/50* (2006.01)
*H01L 51/00* (2006.01)

(52) U.S. Cl.
CPC ........... *H01L 51/504* (2013.01); *H01L 51/0059* (2013.01); *H01L 51/0085* (2013.01)

(58) Field of Classification Search
CPC ..... H01L 51/56; H01L 33/62; H01L 51/5012; H01L 51/0072; H01L 2224/48091; H01L 33/60; H01L 51/5253; H01L 33/32; H01L 33/502; H01L 33/58; H01L 51/5016; H01L 51/504; H01L 51/5203; H01L 2924/00
See application file for complete search history.

(56) References Cited

U.S. PATENT DOCUMENTS

| | | | | |
|---|---|---|---|---|
| 2006/0134460 A1* | 6/2006 | Kondakova et al. | .......... | 428/690 |
| 2007/0241669 A1* | 10/2007 | Liu et al. | ........................ | 313/504 |
| 2008/0224132 A1* | 9/2008 | Forrest et al. | ..................... | 257/40 |
| 2008/0286610 A1* | 11/2008 | Deaton et al. | .................. | 428/704 |
| 2010/0314648 A1* | 12/2010 | Fehrer et al. | ..................... | 257/98 |
| 2014/0175388 A1* | 6/2014 | Lin | ................................. | 257/40 |

FOREIGN PATENT DOCUMENTS

CN  102169965 A  8/2011

* cited by examiner

*Primary Examiner* — Robert Bachner
(74) *Attorney, Agent, or Firm* — Alston & Bird LLP

(57) ABSTRACT

An OLED is disclosed which includes an anode, a hole transport layer, a light emitting layer, an electron transport layer, and a cathode. The light emitting layer includes a first phosphorescent light emitting layer, a blue fluorescent light emitting layer, and a second phosphorescent light emitting layer, which are stacked along a direction from the anode to the cathode. The first phosphorescent light emitting layer includes a material capable of conducting holes and blocking electrons. The second phosphorescent light emitting layer includes a material capable of conducting electrons and blocking holes. The blue fluorescent light emitting layer includes a material capable of conducting both holes and electrons. With the phosphorescent light emitting layers having a function of restricting charges, the exciton recombination zone is constrained in the blue fluorescent light emitting layer.

16 Claims, 4 Drawing Sheets

ORGANIC LIGHT EMITTING DIODE

CROSS-REFERENCES TO RELATED APPLICATIONS

This application claims priority to Chinese patent application No. 201210566199.5 filed on Dec. 21, 2012 and titled "ORGANIC LIGHT EMITTING DIODE", which is incorporated herein by reference in its entirety.

BACKGROUND OF THE INVENTION

Technical Field

The present invention relates to display technologies, and in particular, to an organic light emitting diode.

An Organic Light Emitting Diode (OLED) emits light when a voltage is applied across an organic film, and is increasingly used in flat panel displays, illuminations, and backlights.

A White Organic Light Emitting Diode (WOLED) with a common phosphorescent material possesses poor stability due to the lack of a good dark blue phosphorescent material therein. Also, a WOLED of a structure with combined phosphorescence and fluorescence utilizes both singlet excitons and triplet excitons, but the singlet excitons (i.e. fluorescent excitons) are different from the triplet excitons (i.e. phosphorescent excitons) in terms of energy and a transfer property. In addition, a charge recombination zone changes depending on the voltage, so that the WOLED has a complex structure, a low energy utilization and a low light emitting efficiency. And more particularly, the optical spectrum of a WOLED device tends to significantly change according to applied voltage, which leads to a poor color stability.

BRIEF SUMMARY OF THE INVENTION

One inventive aspect is an organic light emitting diode, including an anode, a cathode, and a light emitting layer. The light emitting layer includes a first phosphorescent light emitting layer configured to conduct holes and to block electrons, a blue fluorescent light emitting layer configured to conduct electrons and to conduct holes, and a second phosphorescent light emitting layer configured to conduct electrons and to block holes. The first phosphorescent light emitting layer, the blue fluorescent light emitting layer, and the second phosphorescent light emitting layer are sequentially stacked along a direction from the anode to the cathode. The organic light emitting diode also includes a hole transport layer between the anode and the light emitting layer, and an electron transport layer between the light emitting layer and the cathode.

Another inventive aspect is an organic light emitting diode, including an anode, a cathode, and a light emitting layer. The light emitting layer includes a first phosphorescent light emitting layer configured to conduct holes and to block electrons, a blue fluorescent light emitting layer configured to conduct electrons and to conduct holes, and a second phosphorescent light emitting layer configured to conduct electrons and to block holes. The first phosphorescent light emitting layer, the blue fluorescent light emitting layer, and the second phosphorescent light emitting layer are sequentially stacked along a direction from the anode to the cathode.

DETAILED DESCRIPTION OF THE INVENTION various technical aspects of the present invention are described by way of certain example embodiments in conjunction with the accompanying drawings.

Figure 1:
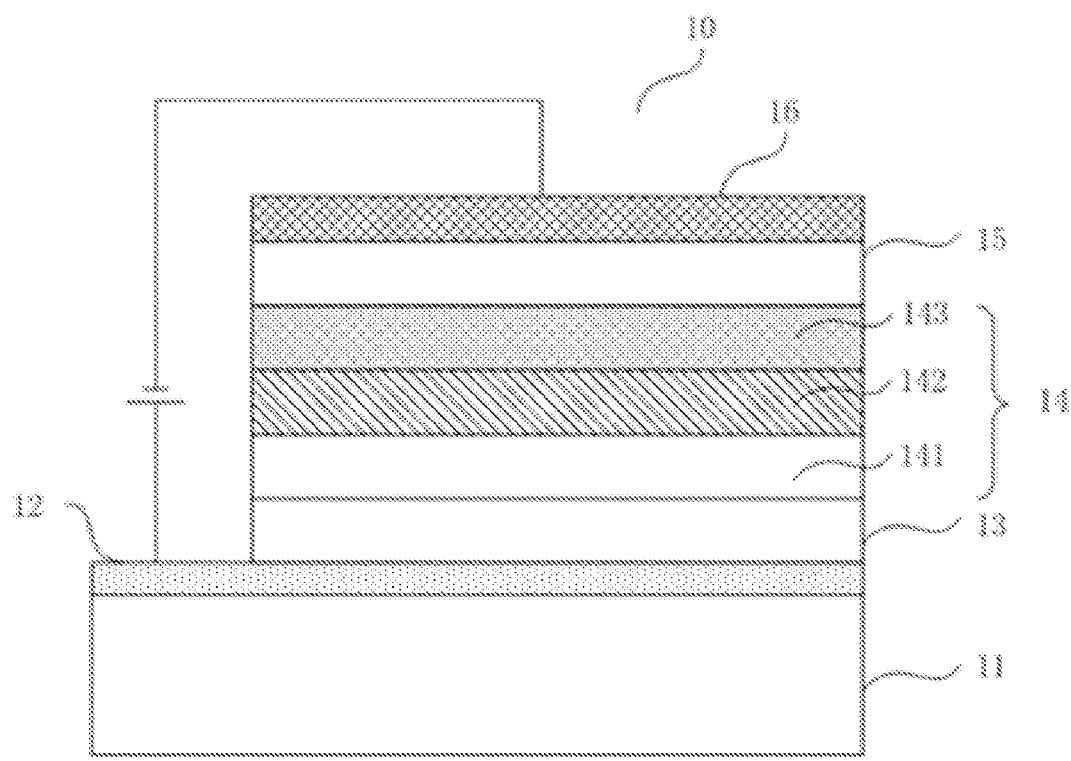
FIG. 1 is a schematic diagram of a structure of an OLED according to a first embodiment of the present invention.

FIG. 1 is a schematic diagram of a structure of an OLED according to a first embodiment of the present invention. As shown in FIG. 1, the OLED 10 includes a substrate 11, an anode 12, a hole transport layer 13, a light emitting layer 14, an electron transport layer 15, and a cathode 16, which are sequentially stacked.

The light emitting layer 14 includes a first phosphorescent light emitting layer 141, a blue fluorescent light emitting layer 142, and a second phosphorescent light emitting layer 143, which are sequentially stacked along a direction from the anode to the cathode.

A material capable of conducting holes and blocking electrons is employed in the first phosphorescent light emitting layer 141 as its host material, and a material capable of conducting electrons and blocking holes is employed in the second phosphorescent light emitting layer 143 as its host material. In addition, a material capable of conducting both electrons and holes is employed in the blue fluorescent light emitting layer 142.

The first and the second phosphorescent light emitting layers 141, 143 may be of the same color or maybe different colors.

For example, both the first and the second phosphorescent light emitting layers 141, 143 may be yellow phosphorescent light emitting layers or maybe red phosphorescent light emitting layers. Alternatively, the first and the second phosphorescent light emitting layers 141, 143 may respectively be a red phosphorescent light emitting layer and a green phosphorescent light emitting layer. In some embodiments, the first and the second phosphorescent light emitting layers 141, 143 are respectively a green phosphorescent light emitting layer and a red phosphorescent light emitting layer.

When a current is applied to the OLED, holes are injected to the light emitting layer 14 from the anode 12 through the hole transport layer 13, and electrons are injected to the light emitting layer 14 from the cathode 16 through the electron transport layer 15. The injected holes and electrons are respectively transferred toward electrodes with opposite charges. When an electron and a hole are localized at the same molecule, they recombine and an "exciton", or a localized electron-hole pair of an excited energy state, is formed. Light is emitted due to a transition of the exciton from an excited state back to a ground state. When electrons and holes meet each other, their recombination results in excitons, of which 25% may be singlet excitons and 75% may be triplet excitons. The transition from the excited singlet state to the ground state causes the emission of fluorescent light, and the transition from the excited triplet state to the ground state causes emission of phosphorescent light. The phosphorescent light emitting process includes a transition involving the change of spin multiplicity and is constrained by a spin factor. Thus, as a consequence, its transition rate is much lower than the transition rate of the fluorescent emitting process. Accordingly, the triplet exciton travels a longer distance due to its longer life. Further, the fluorescent material in the organic light emitting material emits fluorescent light by means of radiation attenuation of the singlet excitons, while the phosphorescent material in the organic light emitting material emits phosphorescent light by means of radiation attenuation of the triplet excitons.

In this embodiment, the first phosphorescent light emitting layer 141 is designed to be a layer of material capable of conducting holes and blocking electrons, and the second phosphorescent light emitting layer 143 is designed to be a layer of material capable of conducting electrons and blocking holes. The first phosphorescent light emitting layer 141 is provided at the side of the blue fluorescent light emitting layer 142 away from the cathode, and the second phosphorescent light emitting layer 143 is provided at the side of the blue fluorescent light emitting layer 142 away from the anode. Therefore, the holes injected from the anode into the blue fluorescent light emitting layer 142 are blocked by the second phosphorescent light emitting layer 143, and hence cannot continue to the cathode. Likewise, the electrons injected from the cathode into the blue fluorescent light emitting layer 142 are blocked by the first phosphorescent light emitting layer 141, and hence cannot continue to the anode. Thus, the electrons and the holes are substantially restricted to the blue fluorescent light emitting layer 142 for combination. That is, the exciton recombination zone is constrained generally to the blue fluorescent light emitting layer 142, so that most excitons are generated in the blue fluorescent light emitting layer 142. As a result, the fluorescent excitons (singlet excitons) can be utilized by the fluorescent material in the blue fluorescent light emitting layer. This occurs because they cannot pass through the blue fluorescent light emitting layer 142 to reach the phosphorescent light emitting layers due to their short lives. The phosphorescent excitons (triplet excitons), however, can be utilized by the phosphorescent material in the phosphorescent light emitting layer, since they can pass through blue fluorescent light emitting layer 142 due to their long lives which lead to long diffusion distances. Therefore, both the singlet excitons and the triplet excitons can be better utilized, thus improving the light emitting efficiency of the device.

Regarding the structure of the OLED, the thicknesses of the first phosphorescent light emitting layer and the second phosphorescent light emitting layer may be selected to control the distribution of the excitons (i.e., energy) in the light emitting layer, thereby controlling the brightness and other color characteristics of various primary colors, in order to achieve a white balance or other desired effect.

Figure 2:
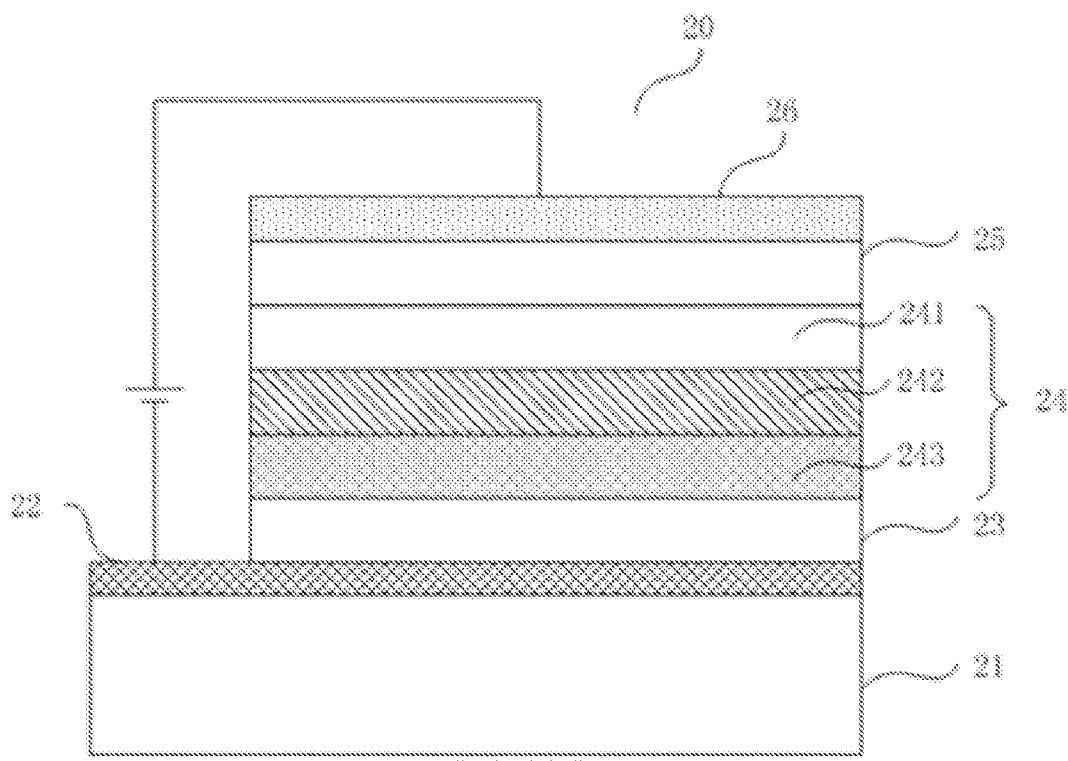
FIG. 2 is a schematic diagram of a structure the OLED according to another implementation of the first embodiment of the present invention.

In another implementation, as shown in FIG. 2, an OLED 20 includes a substrate 21, a cathode 22, an electron transport layer 23, a light emitting layer 24, a hole transport layer 25, and an anode 26, which are stacked. That is, the anode 26 is located on the top of the OLED 20. The OLED 20 may be referred as an "inverted" OLED, since some OLEDs are constructed with a structure in which the cathode is located above the anode. Correspondingly, the light emitting layer 24 includes a first phosphorescent light emitting layer 241, a blue fluorescent light emitting layer 242, and a second phosphorescent light emitting layer 243, which are stacked along a direction from the anode to the cathode.

Here, a material capable of conducting holes and blocking electrons is employed in the first phosphorescent light emitting layer 241 as its host material, a material capable of conducting electrons and blocking holes is employed in the second phosphorescent light emitting layer 243 as its host material, and a material capable of conducting both electrons and holes is employed in the blue fluorescent light emitting layer 242. In the "inverted" OLED, a metal layer, for example, with a thickness of about 10-20 nm formed with one or more of Ag and Mg is employed as a transparent cathode, and a metal layer, for example, with a larger thickness formed with one or more of Ag and Mg is employed as a semitransparent anode.

In this embodiment, by providing the structure of the phosphorescent light emitting layers which has a function of restricting charges, the exciton recombination zone is constrained in the blue fluorescent light emitting layer. As a result, the fluorescent excitons with a short diffusion distance are utilized by the blue fluorescent light emitting layer and the phosphorescent excitons with a longer diffusion distance are utilized by the phosphorescent light emitting layer. Consequently, the excitons are isolated to corresponding light emitting layers and improving the light emitting efficiency and light stability of the OLED.

Figure 3:
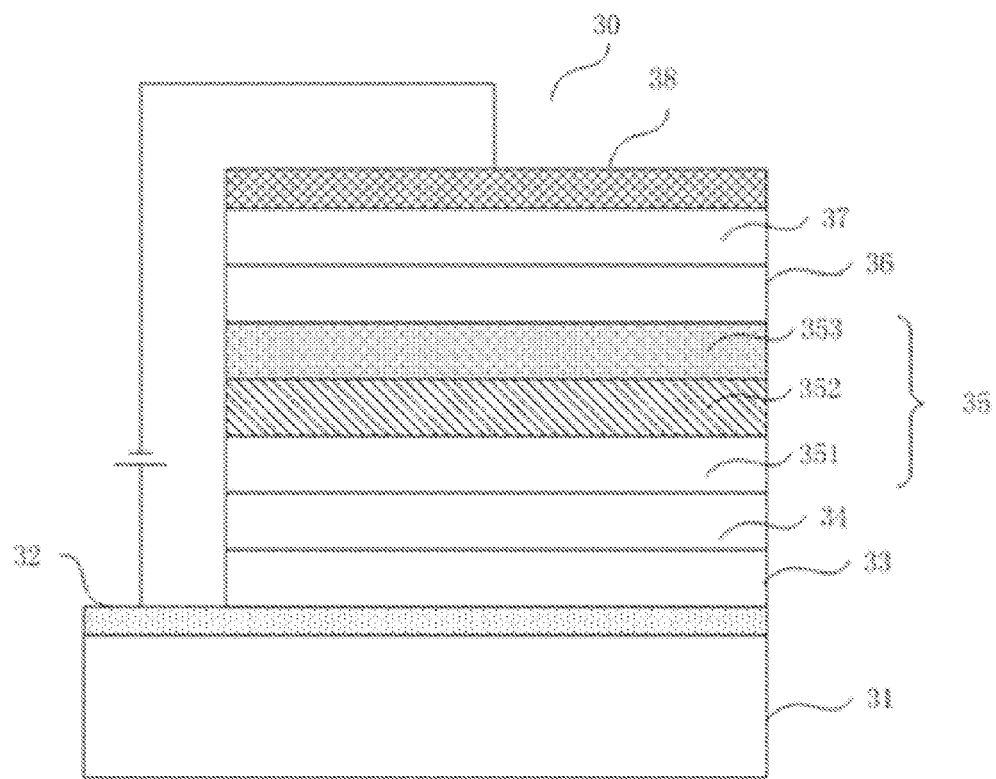
FIG. 3 is a schematic diagram of a structure of the OLED according to another embodiment of the present invention.

FIG. 3 is a schematic diagram of the structure of an OLED according to another embodiment of the present invention. As shown in FIG. 3, the OLED 30 includes a substrate 31, an anode 32, a hole injection layer 33, a hole transport layer 34, a light emitting layer 35, an electron transport layer 36, an electron injection layer 37, and a cathode 38, which are stacked.

The light emitting layer 35 is formed with a composite structure, which includes a first phosphorescent light emitting layer 351, a blue fluorescent light emitting layer 352, and a second phosphorescent light emitting layer 353, which are stacked along a direction from the anode to the cathode.

Here, a material capable of conducting holes and blocking electrons is employed in the first phosphorescent light emitting layer as its host material, a material capable of conducting electrons and blocking holes is employed in the second phosphorescent light emitting layer as its host material, and a material capable of conducting both electrons and holes is employed in the blue fluorescent light emitting layer.

In some embodiments, the anode 32 comprises a film of Indium Tin Oxide (ITO), Indium Zinc Oxide (IZO), or other transparent conductive material.

The hole injection layer 33 comprises 4,4',4"-tris(3-methylphenylphenylamino)-triphenylamine (m-MTDATA), and has a thickness of about 10 nm.

The hole transport layer 34 may be formed by 4,4'-cyclohexylidenebis[N,N-bis(4-methylphenyl)aniline] (TAPC), and has a thickness of about 30 nm In some embodiments, the electron transport layer 36 and electron injection layer 37 each comprise 2,9-dimethyl-4,7-diphenyl-1,10-phenanthroline (BCP), and have thicknesses of about 30 nm.

The cathode 38 may be formed with a composite cathode structure, which comprises a Lithium Fluoride (LiF) layer having a thickness of about 1 nm and an Aluminum (Al) layer located thereon.

In some embodiments, the light emitting layer 35 is formed with a composite structure having a first phosphorescent light emitting layer in which a material of TAPC capable of conducting holes is employed as its host material, and a second phosphorescent light emitting layer in which a material of 2,9-dimethyl-4,7-diphenyl-1,10-phenanthroline (BCP) capable of conducting electrons is employed as its host material. Accordingly, the host material of the first phosphorescent light emitting layer is the same as the material of the hole transport layer, and the host material of the second phosphorescent light emitting layer is the same as the material of the electron transport layer.

The first phosphorescent light emitting layer may be formed as a green light emitting layer, which may be formed by doping a guest material of tris(2-phenylpyridine)iridium (Ir(ppy)$_3$) into the host material of TAPC at a molar ratio of about 7%. The second phosphorescent light emitting layer may be formed as a red light emitting layer, which may be formed by doping a guest material of tris(2-phenylquinoline) iridium (Ir(2-phq)$_3$) into the host material of BCP at a molar ratio of about 8%.

In some embodiments, the blue fluorescent light emitting layer 352 comprises 4,4'-bis(2,2-diphenylvinyl)biphenyl (DPVBi), and has a thickness of about 5-20 nm, and preferably a thickness of about 10 nm. The blue fluorescent light emitting layer 352 can also be formed another organic fluorescent light emitting material.

In some embodiments, the first phosphorescent light emitting layer, the blue fluorescent light emitting layer, and the second phosphorescent light emitting layer are respectively formed as green, blue, and red primary-color light emitting layers to collectively emit white light.

The first and the second phosphorescent light emitting layers can be of the same color or maybe of different colors. For instance, the first and the second phosphorescent light emitting layers may be phosphorescent light emitting layers with a color complementary to blue, for example, yellow or red phosphorescent light emitting layers. In such embodiments, the blue fluorescent light emitting layer combined with the first and second phosphorescent light emitting layers collectively emit white light. If the OLED is intended to emit light of another desired color, the first and the second phosphorescent light emitting layers can also be embodied as primary-color light emitting layers which emit light to be combined with blue color to obtain the desired color.

In some embodiments, the first phosphorescent light emitting layer, the blue fluorescent light emitting layer, and the second phosphorescent light emitting layer have thicknesses of a range from about 5 nm to about 20 nm. for example, the first phosphorescent light emitting layer may have a thickness of about 10 nm, the blue fluorescent light emitting layer may have a thickness of about 10 nm, and the second phosphorescent light emitting layer may have a thickness of about 12 nm.

It should be understood by those skilled in the art that the materials and thicknesses in the embodiments discussed herein are examples of specific implementations of the present invention. Other alternative materials with similar function may be selected, and the thicknesses of the different layers in the composite light emitting layers may be adjusted to achieve a desired light effect.

Figure 4:
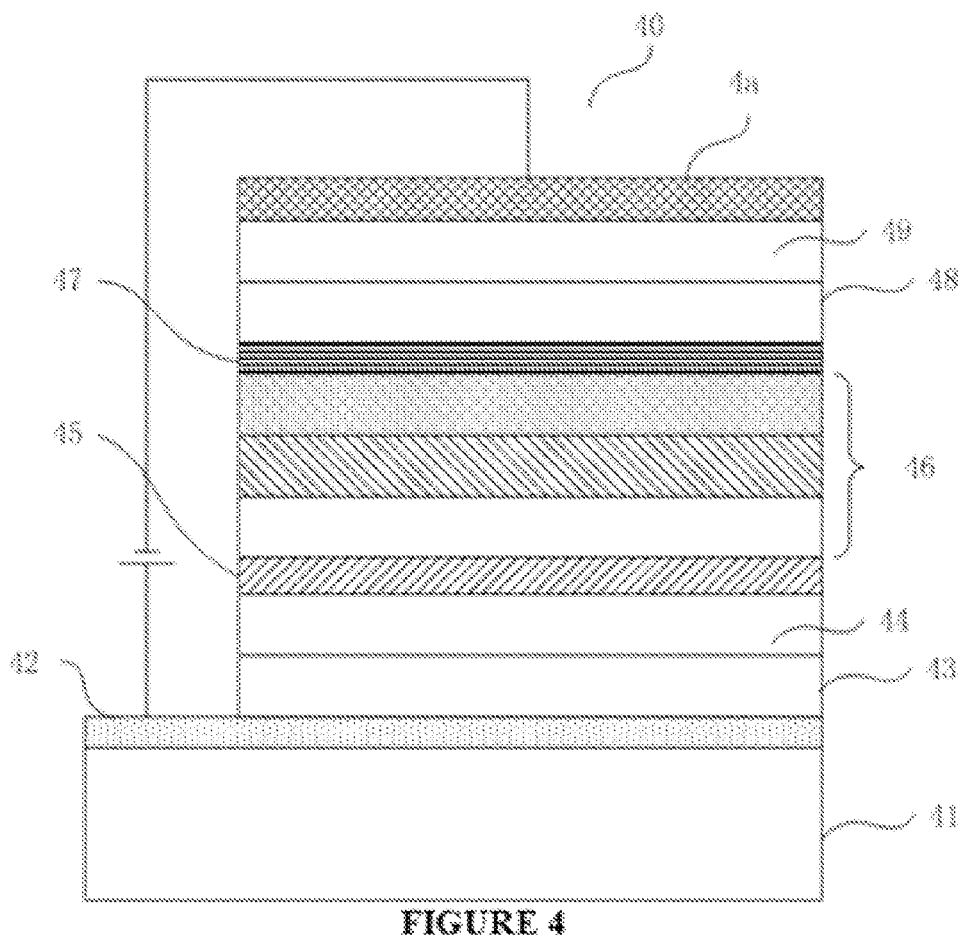
FIG. 4 is a schematic diagram of a structure of the OLED according to a third embodiment of the present invention.

FIG. 4 is a schematic diagram of a structure of an OLED according to a third embodiment of the present invention. As shown in FIG. 4, the OLED 40 includes a substrate 41, an anode 42, a hole injection layer 43, a hole transport layer 44, a first exciton constraining layer 45, a light emitting layer 46, a second exciton constraining layer 47, an electron transport layer 48, an electron injection layer 49, and a cathode 4a, which are stacked. That is, the OLED 40 according to the third embodiment is additionally provided with the first exciton constraining layer 45 and the second exciton constraining layer 47 compared with that of the embodiments discussed above. The first exciton constraining layer 45 and the second exciton constraining layer 47 are each a layer of material capable of conducting holes and blocking electrons and a layer of material capable of conducting electrons and blocking holes, respectively. Thus, electrons traveling from the cathode toward the anode in FIG. 4, after being blocked by a first isolation layer of the light emitting layer 46, can also be blocked by the first exciton constraining layer 45 if passing through the first isolation layer, so that the electrons are recombined with the holes in the light emitting layer 46. Likewise, holes traveling from the anode toward the cathode in FIG. 4, after being blocked by a second isolation layer of the light emitting layer 46, can also be blocked by the second exciton constraining layer 47 to stay in the light emitting layer 46 for recombining with the electrons if passing through the second isolation layer. As a result, the light emitting efficiency of the OLED is further improved.

In this embodiment, by providing the first and the second exciton constraining layers, the exciton recombination zone is further constrained in the light emitting layer, thereby further improving the light emitting efficiency of the OLED.

The disclosed embodiments of the present invention have been described but are not intended to limit the invention. For those skilled in the art, various modifications and changes can be made for the present invention. Any modifications, equivalent replacements, improvements, etc. made within the principles of the present invention, should be included within the protection scope of the invention.

What is claimed is:

1. An organic light emitting diode, comprising:
   an anode;
   a cathode;
   a light emitting layer, comprising:
     a first phosphorescent light emitting layer configured to conduct holes and to block electrons,
     a blue fluorescent light emitting layer configured to conduct electrons and to conduct holes, and
     a second phosphorescent light emitting layer configured to conduct electrons and to block holes,
     wherein at least one of:
     a) the first phosphorescent light emitting layer is a green phosphorescent light emitting layer formed by doping a guest material of tris(2-phenylpyridine)iridium (Ir(ppy)3) into a host material of TAPC at a molar ratio of about 7%, and
     b) the second phosphorescent light emitting layer is a red phosphorescent light emitting layer formed by doping a guest material of tris(2-phenylquinoline) iridium (Ir(2-phq)3) into a host material of BCP at a molar ratio of about 8%, and
     wherein the first phosphorescent light emitting layer, the blue fluorescent light emitting layer, and the second phosphorescent light emitting layer are sequentially stacked along a direction from the anode to the cathode such that the first phosphorescent light emitting layer directly contacts the blue fluorescent light emitting layer, and the blue fluorescent light emitting layer directly contacts the second phosphorescent light emitting layer;
   a hole transport layer between the anode and the light emitting layer; and
   an electron transport layer between the light emitting layer and the cathode.

2. The organic light emitting diode of claim 1, wherein, the blue fluorescent light emitting layer comprises 4,4'-bis(2,2-diphenylvinyl)biphenyl (DPVBi).

3. The organic light emitting diode of claim 1, wherein a thickness of each of the blue fluorescent light emitting layer, the first phosphorescent light emitting layer, and the second phosphorescent light emitting layer is of a range from about 5 nm to about 20 nm.

4. The organic light emitting diode of claim 3, wherein, the thickness of the blue fluorescent light emitting layer is about 10 nm, the thickness of the first phosphorescent light emitting layer is about 10 nm, and the thickness of the second phosphorescent light emitting layer is about 12 nm.

5. The organic light emitting diode of claim 1, wherein the first phosphorescent light emitting layer comprises 4,4'-cyclohexylidenebis[N,N-bis(4-methylphenyl)aniline] (TAPC).

6. The organic light emitting diode of claim 1, wherein the second phosphorescent light emitting layer comprises 2,9-dimethyl-4,7-diphenyl-1,10-phenanthroline (BCP).

7. The organic light emitting diode of claim 1, wherein, the first and the second phosphorescent light emitting layers are of the same color.

8. The organic light emitting diode of claim 7, wherein both the first and the second phosphorescent light emitting layers are yellow or red phosphorescent light emitting layers.

9. The organic light emitting diode of claim 1, wherein, the first and the second phosphorescent light emitting layers are different colors.

10. The organic light emitting diode of claim 9, wherein:
the first phosphorescent light emitting layer is a red phosphorescent light emitting layer and the second phosphorescent light emitting layer is a green phosphorescent light emitting layer; or
the first phosphorescent light emitting layer is a green phosphorescent light emitting layer and the second phosphorescent light emitting layer, is a red phosphorescent light emitting layer.

11. The organic light emitting diode of claim 1, further comprising a hole injection layer located between the anode and the hole transport layer, and an electron injection layer located between the cathode and the electron transport layer.

12. The organic light emitting diode of claim 11, wherein, the host material of the first phosphorescent light emitting layer is the same as a material of the hole transport layer.

13. The organic light emitting diode of claim 11, wherein, a host material of the second phosphorescent light emitting layer is the same as a material of the electron transport layer.

14. The organic light emitting diode of claim 11, further comprising:
a first exciton constraining layer between the light emitting layer and the hole transport layer, wherein the first exciton constraining layer is configured to conduct holes and blocking electrons; and
a second exciton constraining layer located between the light emitting layer and the electron transport layer, wherein the second exciton constraining layer is configured to conduct electrons and to block holes.

15. An organic light emitting diode, comprising:
an anode;
a cathode;
a light emitting layer, comprising:
a first phosphorescent light emitting layer configured to conduct holes and to block electrons, wherein, the first phosphorescent light emitting layer is a green phosphorescent light emitting layer formed by doping a guest material of tris(2-phenylpyridine)iridium (Ir(ppy)3) into a host material of TAPC at a molar ratio of about 7%,
a blue fluorescent light emitting layer configured to conduct electrons and to conduct holes, and
a second phosphorescent light emitting layer configured to conduct electrons and to block holes,
wherein the first phosphorescent light emitting layer, the blue fluorescent light emitting layer, and the second phosphorescent light emitting layer are sequentially stacked along a direction from the anode to the cathode;
a hole transport layer located between the anode and the light emitting layer; and
an electron transport layer located between the light emitting layer and the cathode.

16. An organic light emitting diode, comprising:
an anode;
a cathode;
a light emitting layer, comprising:
a first phosphorescent light emitting layer configured to conduct holes and to block electrons,
a blue fluorescent light emitting layer configured to conduct electrons and to conduct holes, and
a second phosphorescent light emitting layer configured to conduct electrons and to block holes, wherein, the second phosphorescent light emitting layer is a red phosphorescent light emitting layer formed by doping a guest material of tris(2-phenylquinoline)iridium (Ir(2-phq)3) into a host material of BCP at a molar ratio of about 8%,
wherein the first phosphorescent light emitting layer, the blue fluorescent light emitting layer, and the second phosphorescent light emitting layer are sequentially stacked along a direction from the anode to the cathode;
a hole transport layer located between the anode and the light emitting layer; and
an electron transport layer located between the light emitting layer and the cathode.

* * * * *